(12) United States Patent
Corradini et al.

(10) Patent No.: US 11,174,059 B2
(45) Date of Patent: Nov. 16, 2021

(54) DECORATION APPARATUS FOR DECORATING A WEB OF LABELING MATERIAL AND METHOD OF DECORATING A WEB OF LABEL MATERIAL

(71) Applicant: Sidel Participations, Octeville-sur-mer (FR)

(72) Inventors: Stefano Corradini, Mantova (IT); Giacomo Paradiso, Mantova (IT); Stefano Pini, Parma (IT); Luc Desoutter, Le Havre (FR); Federico Busolo, Mantova (IT); Nicola Veneziani, Parma (IT)

(73) Assignee: SIDEL PARTICIPATIONS, Octeville-sur-mer (FR)

(*) Notice: Subject to any disclaimer, the term of this patent is extended or adjusted under 35 U.S.C. 154(b) by 97 days.

(21) Appl. No.: 16/603,217

(22) PCT Filed: Apr. 4, 2017

(86) PCT No.: PCT/EP2017/057983
§ 371 (c)(1),
(2) Date: Oct. 4, 2019

(87) PCT Pub. No.: WO2018/184665
PCT Pub. Date: Oct. 11, 2018

(65) Prior Publication Data
US 2020/0122872 A1  Apr. 23, 2020

(51) Int. Cl.
*B65C 9/46* (2006.01)
*B41J 11/00* (2006.01)
(Continued)

(52) U.S. Cl.
CPC ............... *B65C 9/46* (2013.01); *B29C 65/14* (2013.01); *B29C 65/1603* (2013.01);
(Continued)

(58) Field of Classification Search
CPC .... B29L 2031/744; B41J 11/002; B41J 2/435; B41J 2/442; B41J 2/4753; B41J 2/48;
(Continued)

(56) References Cited

U.S. PATENT DOCUMENTS 5,634,402 A * 6/1997 Rudd .................... B41J 11/0021
101/424.1
2002/0168212 A1* 11/2002 Nedblake, Jr. ....... B41J 11/0021
400/621
(Continued)

FOREIGN PATENT DOCUMENTS

DE  202013105749 U1  4/2014
EP  1625893 A1  2/2006
(Continued)

OTHER PUBLICATIONS

English translation of DE202013105749.*
International search report dated Jan. 3, 2018.

*Primary Examiner* — Sonya M Sengupta

(57) ABSTRACT

The invention discloses a decoration apparatus for decorating a web of labeling material. The decoration apparatus comprises conveyor for advancing the web of labeling material between a first station and a second station, an activation unit adapted to apply an activation energy at a activation station for selectively activating activatable pigments comprised in the web of labeling material or to locally ablate the web of labeling material and a temperature-conditioning unit which is adapted to actively cool and/or heat the web of labeling material, in particular, in use, prior, (Continued)

during and/or after selectively activating the activatable pigments or ablating the web of labeling material.

14 Claims, 10 Drawing Sheets

(51) Int. Cl.
| | |
|---|---|
| *B41M 7/00* | (2006.01) |
| *B65C 3/16* | (2006.01) |
| *B65C 9/18* | (2006.01) |
| *B65C 9/25* | (2006.01) |
| *B29C 65/14* | (2006.01) |
| *B29L 31/00* | (2006.01) |
| *B65C 9/40* | (2006.01) |
| *B29C 65/16* | (2006.01) |

(52) U.S. Cl.
CPC .......... *B41J 11/002* (2013.01); *B41M 7/0081* (2013.01); *B65C 3/16* (2013.01); *B65C 9/1873* (2013.01); *B65C 9/25* (2013.01); *B29L 2031/744* (2013.01); *B65C 2009/1846* (2013.01); *B65C 2009/404* (2013.01); *H05K 2203/107* (2013.01)

(58) Field of Classification Search
CPC ........ B41M 5/24; B41M 5/26; B41M 7/0081; B65C 2009/1846; B65C 2009/404; B65C 3/16; B65C 9/1873; B65C 9/25; B65C 9/46; H05K 2203/107; B29C 65/14; B29C 65/1603
USPC .......................................... 156/272.2, 272.8
See application file for complete search history.

(56) References Cited

U.S. PATENT DOCUMENTS

| | | | |
|---|---|---|---|
| 2010/0045720 A1* | 2/2010 | Williams | B41J 11/002 347/14 |
| 2012/0320117 A1* | 12/2012 | Roof | B41J 11/002 347/9 |
| 2013/0201240 A1* | 8/2013 | Kodama | B41J 11/0015 347/14 |

FOREIGN PATENT DOCUMENTS

| | | | | |
|---|---|---|---|---|
| GB | 2577690 A | * | 4/2020 | ........... B41J 29/377 |
| WO | 2014206940 A1 | | 12/2014 | |

* cited by examiner

DECORATION APPARATUS FOR DECORATING A WEB OF LABELING MATERIAL AND METHOD OF DECORATING A WEB OF LABEL MATERIAL

TECHNICAL FIELD

The present invention relates to a decoration apparatus for decorating a web of labeling material, in particular a web of labeling material comprising photoactivatable pigments.

The present invention also relates to a method of decorating a web of labeling material, in particular a web of labeling material comprising photoactivatable pigments.

BACKGROUND

It is known to pack products into respective packages and to apply information onto the packages for providing the final consumer with differing information and visual images, such as e.g. the packaged product, the brand of the product, the ingredients of the product etc.

An example is the packaging of pourable products such as carbonated liquids (e.g. sparkling water, soft drinks and beer), non-carbonated liquids (e.g. still water, juices, teas, sport drinks, liquid cleaners, wine, etc.), emulsions, suspensions, high viscosity liquids and beverages containing pulps into receptacles such as bottles, containers or the like.

A typical mean of providing the information on these receptacles is to provide at least one respective label onto each one of the receptacles. In the art, different kinds of means of labeling are known.

One typical label type is the so called "self-stick label", which is directly wrapped around at least part of the respective receptacle and glued thereto. The application of this kind of label typically relies on advancing a web of labeling material towards a cutting station at which the single labels are obtained from the web of labeling material by cutting the web of labeling material at the cutting station. These labels are often also referred to as roll-fed-labels.

Another typical label type, used with a particular kind of receptacles, namely, beverage bottles or vessels, is the label commonly known as "sleeve label", which is formed in a tubular configuration and then applied onto the respective article. Finally, a heat shrinking operation is carried out to make the labels adhere onto the respective receptacles.

A further typical label type, are the "pressure-sensitive labels" (PLS), which are removably attached on a base web and which are detached from the base web prior to being applied onto the respective receptacles.

In the recent years, the desire and need to personalize the information and the visual imagines provided on the receptacles containing e.g. the pourable product has grown. This is in particular due to the need to offer to the final costumer more and more possibilities to personalize the final appearance of the receptacle, such as e.g. comprising a particular image or a particular photography or a particular written message, but also as a consequence of the requirement to increase traceability of the overall production process associated to a particular pourable product filed into respective receptacles.

A printing apparatus adapted to provide personalized information on receptacles filled with a pourable product is e.g. known from WO-A-2010034375.

The apparatus comprises a conveyor for advancing a succession of receptacles along a receptacle path and a plurality of printing units arranged one after the other along the receptacle path. Each printing unit is adapted to apply an ink of a defined color directly onto the receptacle or onto a label attached to the receptacle.

However, such an apparatus requires a rather complicated structure and occupies a significant amount of space within a production hall. It comes along with the further drawback, which lies in the use of the ink. Ink directly applied onto the receptacles may diffuse with time through the receptacles into the pourable product, which is particularly critical in the case of pourable food products. Additionally, such an apparatus is rather expensive.

Another apparatus, which provides for a personalization of the information and/or the visual image provided on the receptacles is known from DE-U-202013105749.

The apparatus comprises conveying means for advancing a web of labeling material along an advancement path from a magazine unit towards a labeling station at which the single label sheets (being of the "pressure-sensitive" label type or of the "stick label" type) are attached onto receptacles advancing along a receptacle path through the labeling station. The web of labeling material comprises at least one layer, which contains photoactivatable pigments being in a deactivated state.

The apparatus further comprises an activation unit having a plurality of laser assemblies. The activation unit being arranged upstream from the labeling station. As the web of labeling material advances the laser assemblies are selectively activated in order to selectively activate the pigments, leading to a change in the color of the pigments. Each activation assembly substantially irradiates along an activation line transversal to the web of labeling material.

A drawback of this apparatus is that the extension of the activation line is limited and, thus, the area of the label, which can be activated by the laser irradiation is limited. This again restricts the additional information or the additional visual images, which can be provided on the respective labels of the web of labeling material prior to the attachment of the label sheets onto the receptacles.

A further drawback of such an apparatus is related to its relatively low processing speeds.

SUMMARY OF INVENTION

It is therefore an object of the present invention to provide a decoration apparatus for a web of labeling material to overcome, in a straightforward and low-cost manner, at least one of the aforementioned drawbacks.

It is a further aspect of the present invention to provide for a decoration method for decorating a web of labeling material to overcome, in a straightforward and low-cost manner, at least one of the aforementioned drawbacks.

According to the present invention, there is provided a decoration apparatus as claimed in claim 1.

According to a further aspect of present invention there is provided a decoration method for decorating a web of labeling material.

BRIEF DESCRIPTION OF THE DRAWINGS

Two non-limiting embodiments of the present invention will be described by way of example with reference to the accompanying drawings, in which.

DETAILED DESCRIPTION

Figure 1:
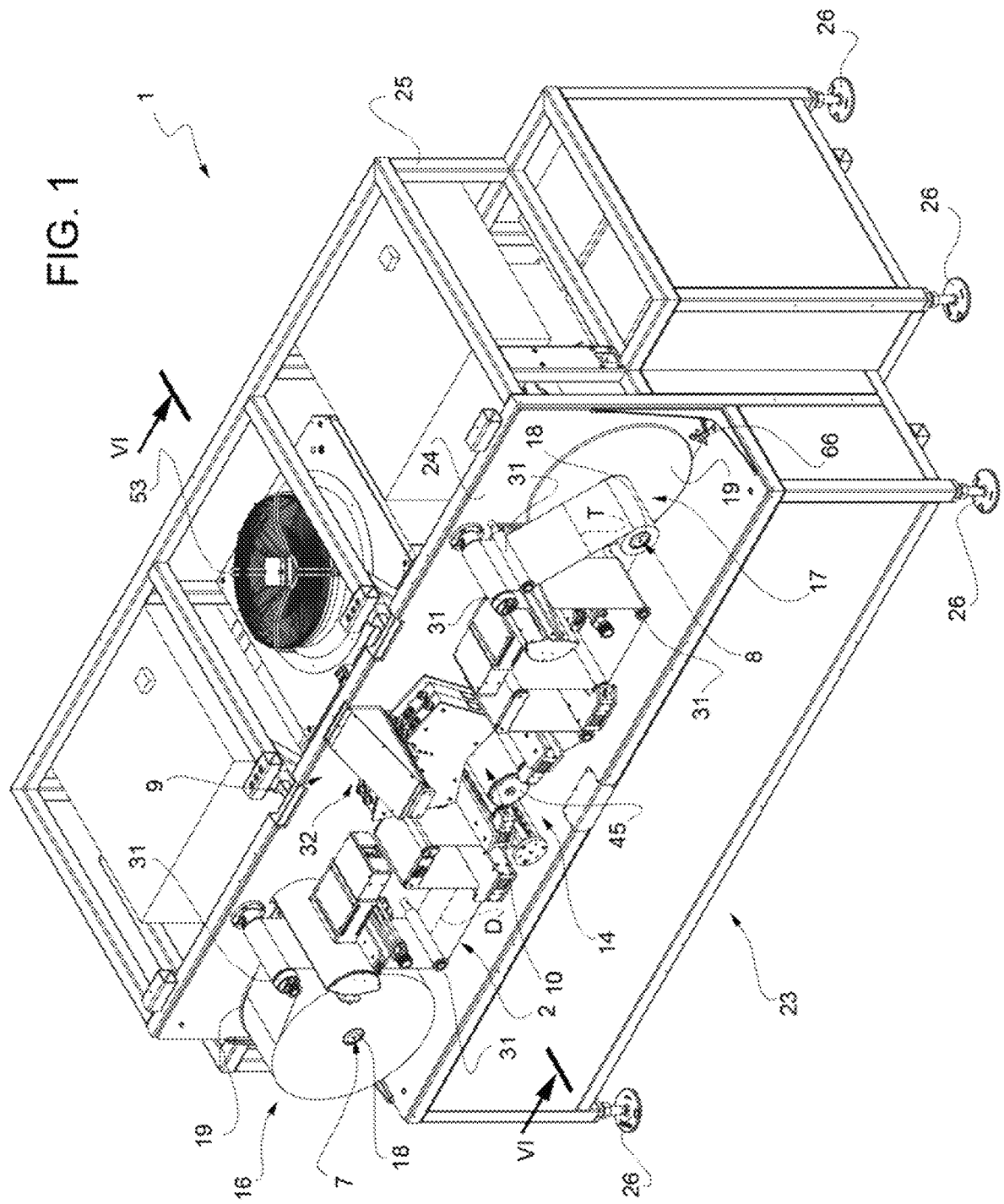
FIG. 1 is a perspective front view of a first embodiment of a decoration apparatus according to the present invention, with parts removed for clarity.

Number 1 in FIG. 1 shows as a whole a decoration apparatus according to the present invention. Apparatus 1 is adapted to decorate a web of labeling material 2.

In the particular embodiment disclosed, web 2 is of the kind, which is to be cut in order to obtain single label sheets (i.e. in the particular embodiment disclosed, web 2 comprises a succession of single label sheets, which, in particular, are obtained by cutting web 2 along respective cutting lines of web 2). However, it must be understood that the description will refer to this kind of web 2 without any limitative scope. It must be further understood, that the present invention can be executed also with any other kind of web of labeling material, such as e.g. a web of labeling material having a base layer and a plurality of label sheets removably attached to the base layer (commonly known as "pressure-sensitive labels") or with a web of labeling material being of a heat-shrinkable material.

Web 2 can be of the pre-decorated type or can be blank. The pre-decorated type already comprises information and/or visual images pre-printed onto web 2. In particular, in the case of a pre-decorated type, apparatus 1 is adapted to complete the decoration of web 2.

In particular, web 2 extends into two dimensions, defined by a transversal direction T and the longitudinal direction D. Even more particular, direction T being perpendicular to direction D.

Figure 2:
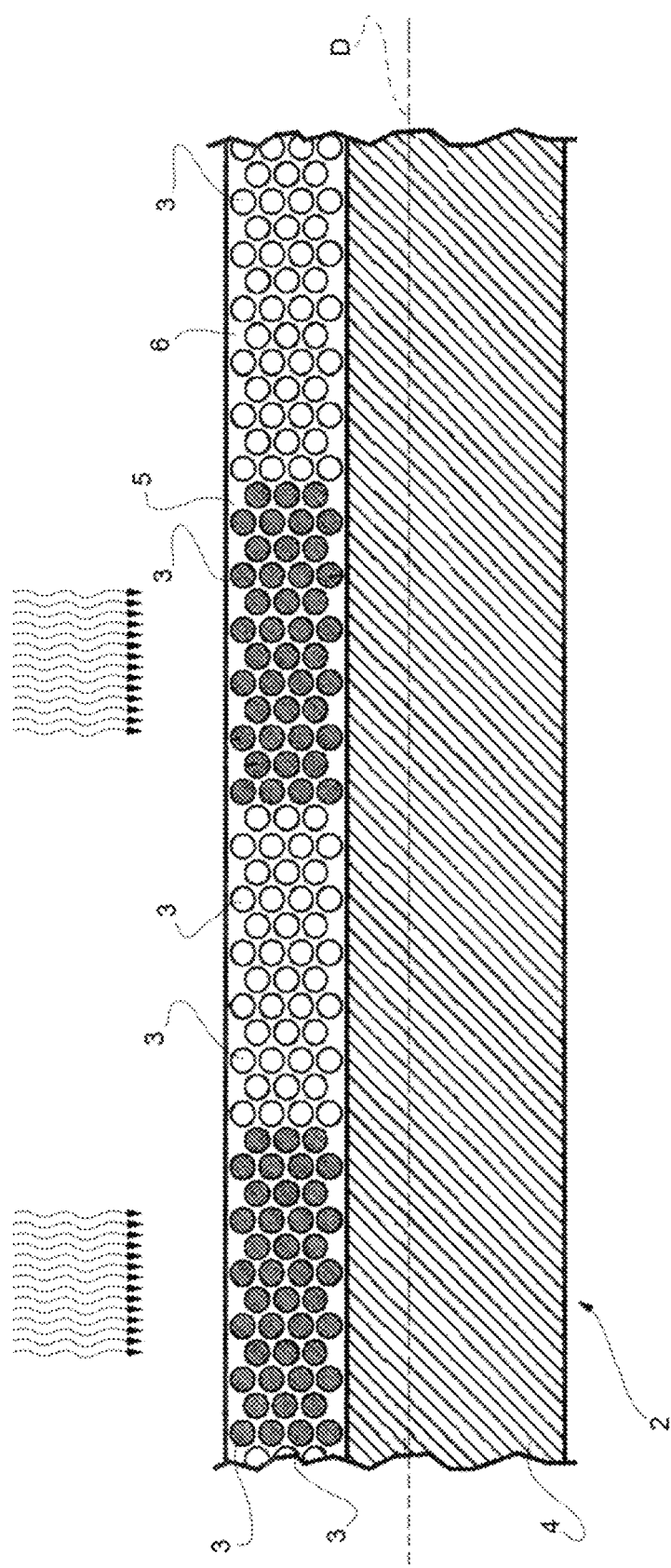
FIG. 2 is a schematic view of a web of labeling material to be decorated by the decoration apparatus of FIG. 1, with parts removed for clarity.

With particular reference to FIG. 2, web 2 comprises activatable pigments, in particular photoactivable pigments 3. Preferably, web 2 comprises at least two layers 4 and 5 and at least layer 5 contains pigments 3. Even more preferentially, each web 2 comprises more than one layer 5 containing pigments 3.

Preferentially, pigments 3 provided in web 2, in particular in layer 5 are in a deactivated state and are adapted to change from their respective deactivated state to at least one respective activated state upon the application of an activation energy, in particular an electromagnetic activation energy, even more particular by light irradiation (e.g. laser light irradiation).

Favorably, the change from the deactivated state to the activated state leads to a change in the color of pigments 3.

Preferentially, when being in the deactivated state pigments 3 are transparent or white. Upon activation pigments 3 can change their respective color (e.g. from transparent to black or white or from white to black). In particular, the color in the deactivated state and the color in the activated state being dependent on the specific molecular structure of the specific pigments 3 chosen.

Preferentially, the final color is defined by the total energy transferred to pigments 3 (e.g. allowing to obtain different gray shades or respective other color tonalities).

Figure 3:
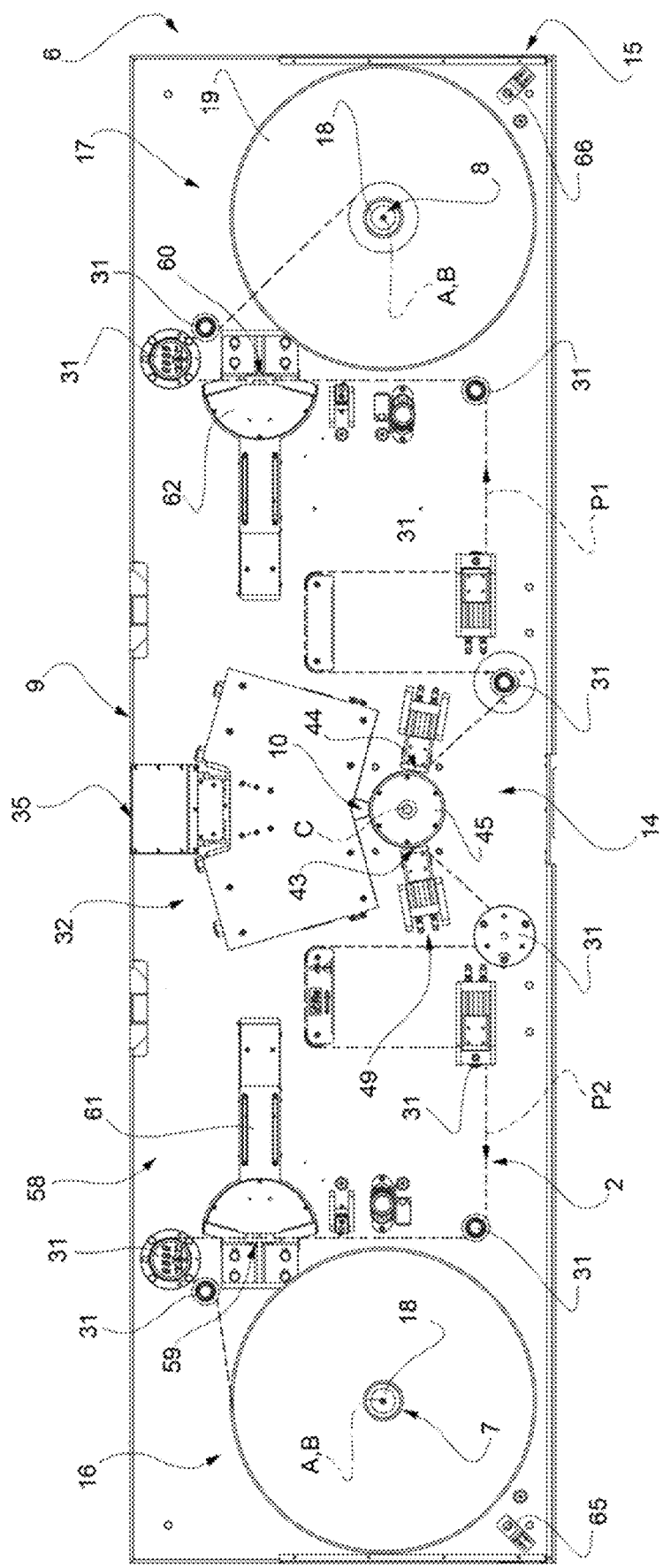
FIG. 3 is a front-side view of details of the decoration apparatus as shown in FIG. 1, with parts removed for clarity.
Figure 4:
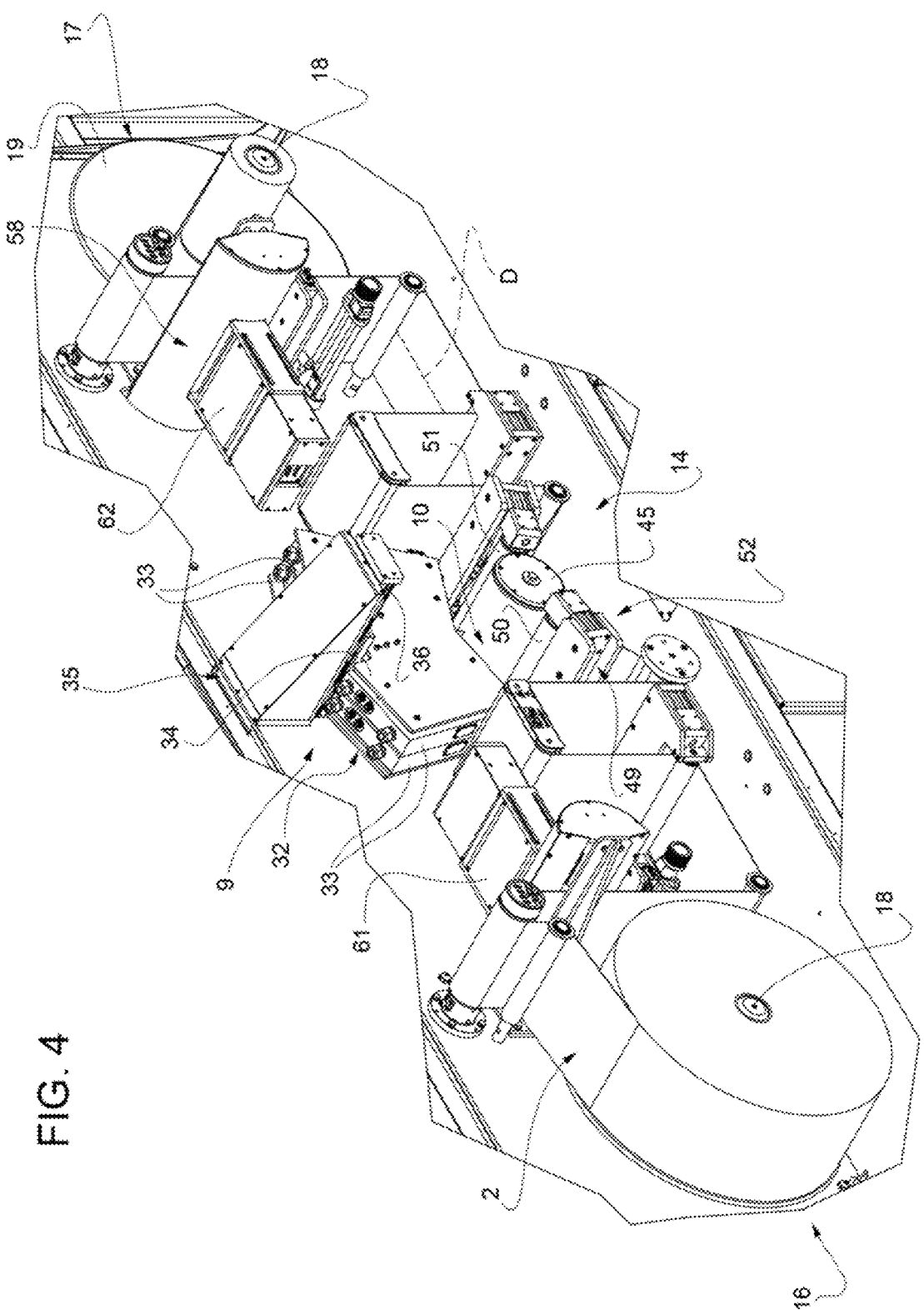
FIG. 4 is a perspective view of the details of FIG. 3, with parts removed for clarity.
Figure 5:
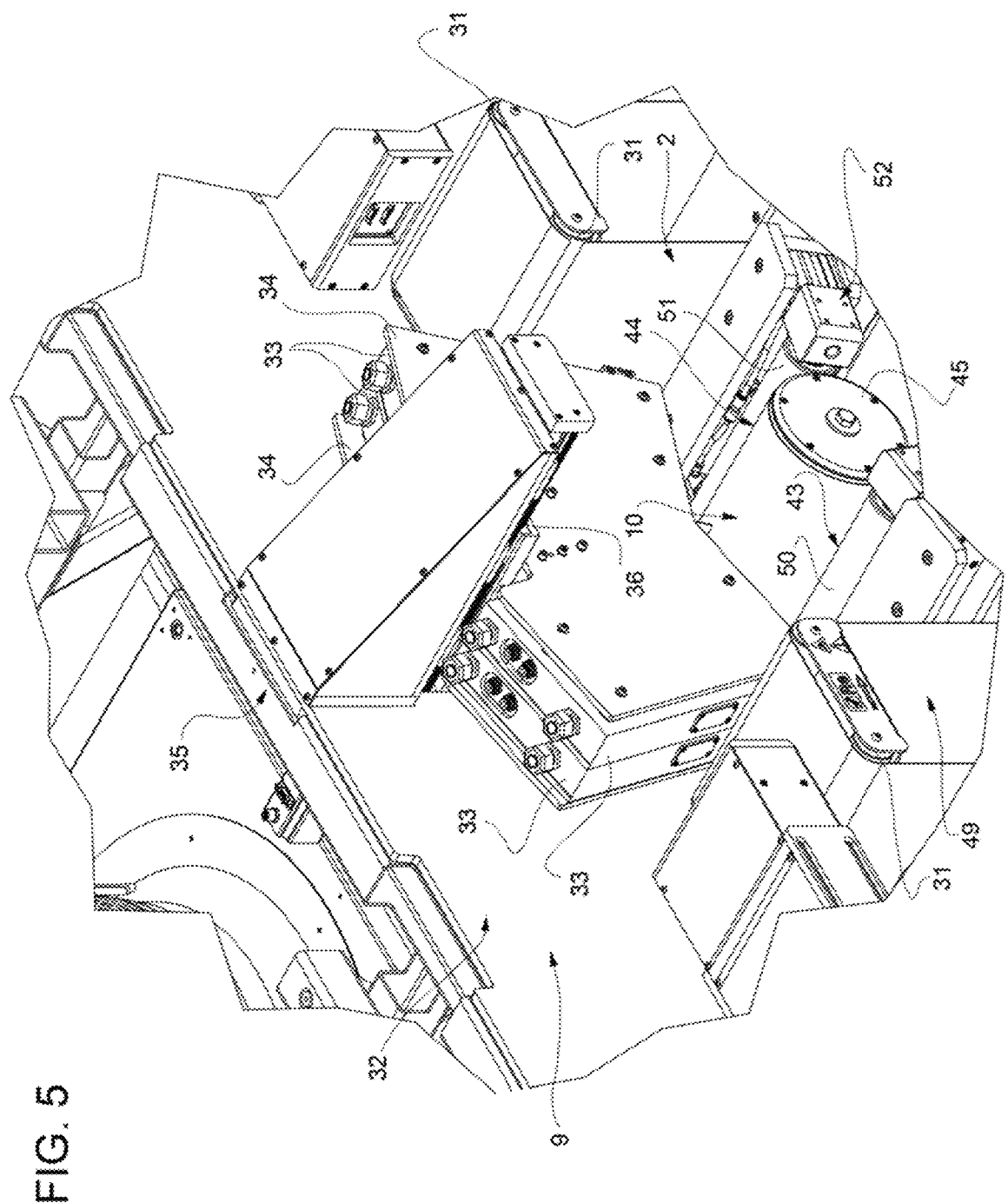
FIG. 5 is an enlarged perspective view of some of the details shown in FIG. 3, with parts removed for clarity.

With particular reference to FIGS. 1, 3 and 4, apparatus 1 comprises:

conveying means 6 for advancing web 2 between a first station 7 and a second station 8, in particular along a longitudinal direction D of web 2;

an activation unit 9 adapted to apply an activation energy, in particular an electromagnetic activation energy, even more particular a light irradiation at a decoration station 10 for selectively activating pigments 3 present in web 2, station 10 being arranged between stations 7 and 8; and a temperature-conditioning unit 14 adapted to actively cool and/or heat web 2, in particular to actively cool web 2, and at least a portion of unit 14 being arranged between stations 7 and 8, in particular in the area of station 10.

Preferentially, apparatus 1 also comprises a control unit 15 adapted to control operation of apparatus 1 itself, in particular unit 15 being adapted to control at least conveying means 6, unit 9 and unit 14.

Preferably, apparatus 1 also comprises a first magazine unit 16 arranged in the area of station 7 being adapted to store and receive web 2. Preferentially, apparatus 1 also comprises a second magazine unit 17 arranged in the area of station 8 being adapted to store and receive web 2.

More specifically, each one of magazine units 16 and 17 is adapted to removably receive a respective reel 18. The respective reel 18 being adapted to carry a wound-up web 2 and/or to receive a web 2 to be wound-up. In particular, each reel 18 being adapted to rotate around a respective rotation axis A, when being received in the respective magazine unit 16.

Even more specifically, each one of magazine units 16 and 17 comprises a respective support base, in particular a respective support disc 19 adapted to rotate around a respective rotation axis B. Each magazine unit 16 and 17 also comprises a respective engagement element (not shown) coaxially attached to the respective support disc 19 and protruding from the respective support disc 19.

In particular, each respective engagement element is adapted to engage with the respective reel 18 in such a manner to coaxially arrange the respective reel 18 with the respective support disc 19.

Preferably, apparatus 1 also comprises a support structure 23 carrying at least conveying means 6 and units 9 and 14. In particular, support structure 23 also carries units 15, 16 and 17.

More specifically, support structure 23 comprises a support plate 24, in particular having a vertical orientation, at least partially carrying conveying means 6 and units 9 and 14.

In particular, support plate 24 also carries units 16 and 17. Even more particular, support plate 24 supports the respective support discs 19. Even more particular, the respective support discs 19 being arranged such that axis B is transversal, in particular orthogonal to support plate 24 (i.e., the respective axes A of reels 18 are transversal, in particular orthogonal to support plate 24 when being coupled to the respective unit 16 or 17).

Even more specifically, support structure 23 comprises a support frame 25 carrying support plate 24. Preferably, support structure 23 also comprises a plurality of feed elements 26 connected to support frame 25 for placing apparatus 1, in particular support structure 23 on a plant floor or other horizontal surfaces. In particular, support structure 23 also comprises a height and orientation-adjusting unit for regulating the height and orientation of apparatus 1. In particular, the height and orientation-adjusting unit is associated to feed elements 26, even more particular, for locally moving support structure 23 to or away from the plant floor or another horizontal surface onto which apparatus 1, in particular support structure 23 is placed.

With particular reference to FIGS. 1, 3 and 4, conveying means 6 are adapted to advance web 2 back and forth between stations 7 and 8. In particular, conveying means 6 are adapted to advance web 2 along a first advancement path P1 from station 7 to station 8, in particular for advancing web 2 from unit 16 to unit 17. Preferentially, conveying means 6 are also adapted to advance web 2 along a second advancement path P2 from station 8 to station 7, in particular for advancing web 2 from unit 17 to unit 16. In particular, paths P1 and P2 being parallel to one another, even more preferably paths P1 and P2 superpose one another.

In particular, station 10 being arranged downstream from station 7 and upstream from station 8 along path P1. Even more particular, station 10 being positioned downstream from station 8 and upstream from station 7 along path P2.

Conveying means 6 comprise a drive unit 29 adapted to drive advancement of web 2 between stations 7 and 8, in particular to drive advancement along paths P1 and P2.

In particular, drive unit 29 comprises at least a first drive assembly (not shown and known as such) arranged in the area of station 7.

Drive unit 29 also comprises a second drive assembly 30 (partially shown in FIG. 7) arranged in the area of station 8.

In particular, the first drive assembly and drive assembly 30 are adapted to cooperate with unit 16 and 17, respectively. In particular, the first drive assembly and drive assembly 30 are adapted to drive rotation of the respective reel 18 around the respective axis A. Even more particular, the first drive assembly and the drive assembly 30 are adapted to drive rotation of the respective support disc 19 around axis B (i.e. the first drive assembly and drive assembly 30 are adapted to indirectly drive rotation of the respective reel 18).

Preferably, the first drive assembly and drive assembly 30 are mounted to support plate 24.

Conveying means 6 also comprise a plurality of rollers 31 interposed between stations 7 and 8 and each one having a respective rotation axis C. In particular, rollers 31 define at least partially paths P1 and/or P2. Even more particular, in use, web 2 is spanned around rollers 31 between stations 7 and 8, in particular between units 16 and 17.

With particular reference to FIGS. 1 and 3 to 7, activation unit 9 comprises an activation device 32 adapted to apply the activation energy, in particular the electromagnetic activation energy, even more particular the light irradiation at station 10 to selectively activate pigments 3 contained in web 2.

In more detail, activation device 32 comprises one or more laser assemblies 33, each one adapted to selectively direct a laser irradiation onto web 2, web 2, in use, being advanced by conveying means 6 between stations 7 and 8.

In particular, each laser assembly 33 is adapted to direct the laser irradiation along a respective activation line, in particular transversal to direction D, even more particular perpendicular to direction D. In other words, the respective activation line being transversal, in particular perpendicular to the, in use, advancing web 2 (i.e. each activation line is parallel to direction T).

In particular, each activation line extends between two respective outer positions. In the particular embodiment described, the distance between the two outer positions ranges from 10 mm to 40 mm, in particular from 20 mm to 30 mm, even more particular the distance between the two extreme outer positions is 25 mm. In use, as web 2 advances between stations 7 and 8 and the respective activation area is activated on web 2 as a consequence of the advancement of web 2 and the selective activation of pigments 3 along the activation line of the respective laser assembly 32.

Preferably, in the case of activation unit 9, in particular activation device 32 comprising more than one laser assembly 33, each laser assembly 33 is adapted to direct the laser irradiation along a differing activation line, in particular so that, in use, the effective area of web 2 is defined by the plurality of activation lines, in particular the collective extension of the activation lines and the advancement of web 2.

Each laser assembly 33 comprises a plurality of laser diodes, each of which being adapted to be selectively controllable. In particular, each laser assembly 33 is adapted to irradiate with light within the near-infrared regime, in particular the light irradiation having a wavelength ranging between 950 nm to 990 nm.

Activation device 32 comprises a housing 34. The one or more laser assemblies 32 are placed within housing 34, in particular they are mounted to housing 34. In particular, in the embodiment shown in FIGS. 1 and 3 to 7, the four laser assemblies 32 are symmetrically arranged within housing 34. A first pair of laser assemblies 33 faces a second pair of laser assemblies 33. However, it must be understood that any number of laser assemblies 33 can be used, including odd and even numbers of laser assemblies 33. It must be further understood, that a symmetrical arrangement is not required for the operation of apparatus 1, in particular of unit 9. I must be further understood that other arrangements of laser assemblies 32 are possible.

Activation unit 9 also comprises a positioning assembly 35 adapted to position activation device 32 with respect to web 2. In particular, positioning assembly 35 is adapted to precisely position activation device 32 with respect to web 2 after placing of web 2 within apparatus 1.

In particular, positioning assembly 35 is adapted to move activation device 32 into a rectilinear direction, in particular into a direction being parallel to axis B. Furthermore, this direction is transversal to direction D, even more particular perpendicular to direction D. In other words, the rectilinear direction is parallel to direction T.

In more detail, positioning assembly 35 comprises:
a track portion 36, which movably carries activation device 32; and
a drive assembly 37 adapted to move activation device 32 into the rectilinear direction.

In even further detail, track portion 36 is connected to support plate 24 and protrudes transversally, in particular perpendicularly away from support plate 24. In particular, track portion 36 is arranged substantially parallel to axis B.

More specifically, drive assembly 37 is adapted to move activation device 32 to and away from support plate 24. Drive assembly 37 comprises an electrical motor 38 and a coupling element (not shown). The coupling element being coupled to activation device 32 and adapted to move activation device 32 into the rectilinear direction upon activation through electrical motor 38. In particular, electrical motor 38 being coupled to support plate 24, even more particular to the side of support plate 24 opposite to the side at which track portion 36 is mounted to support plate 24.

Figure 7:
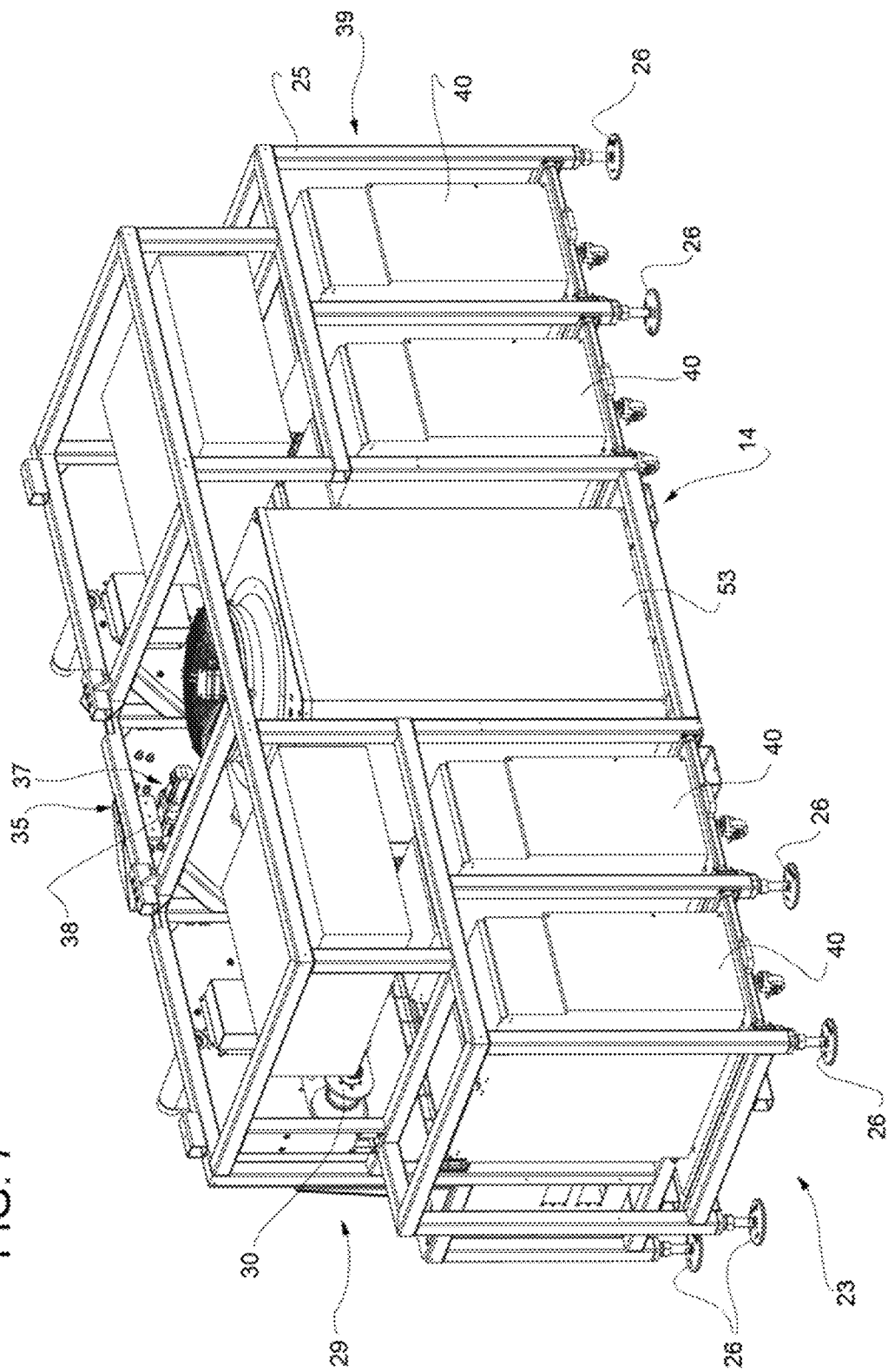
FIG. 7 is a perspective back view of the decoration apparatus of FIG. 1, with parts removed for clarity.

With particular reference to FIG. 7, activation unit 9 also comprises at least one controller assembly 39 adapted to control operation of activation device 32. In particular, controller assembly 39 is electronically connected to activation device 32 for controlling operation of activation device 32. Assembly 39 is adapted to control e.g. the intensity of the activation energy applied, the on and off-times etc. Assembly 39 is also electronically connected to control unit 15. Control unit 15 being adapted to control assembly 39.

In more detail, assembly 39 is adapted to selectively control each laser assembly 33, e.g. to selectively control parameters such as the light intensity, the on-and-off-times etc. Preferably, assembly 39 comprises single controllers 40, each one connected, in particular electronically connected, to one respective laser assembly 33 and each one adapted to selectively control the operation of the respective laser assembly 33.

With particular reference to FIGS. 1, 3 to 7, temperature-conditioning unit 14 is adapted to actively cool or heat web 2 during advancement of web 2 between stations 7 and 8, in particular prior, during and/or after activation of pigments 3 by activation unit 9 at station 10.

In more detail, temperature-conditioning unit 14 is adapted to cool or heat web 2 in the proximity of station 10, in particular so as to avoid a loss in the integrity of web 2, in particular as a consequence of the activation energy, in particular the electromagnetic activation energy, even more particular the laser light irradiation directed, in use, onto web 2 by unit 9 at station 10.

In particular, in the case unit 14 cools, in use, web 2 local temperature increases of web 2 are avoided. Such local temperature increases if increasing above a critical temperature would locally damage web 2 (the critical temperature being dependent on the specific characteristics of web 2). In the case unit 14 heats, in use, web 2, web 2, in particular pigments 3 are pre-conditioned so that activation of pigments 3 can be induced at lower activation energies (i.e. for inducing a change from the deactivated state to an activated state a lower activation energy is necessary with respect to the case of not pre-conditioning the pigments 3 by heating web 2). This allows to operate unit 9 such to induce activation energies at lower intensities, reducing thereby the possibility of a loss in web integrity, in particular due to local temperature increases above a critical temperature.

It must be noted that cooling and/or heating web 2 means that these parts of web 2, which interact with temperature-conditioning unit 14, are cooled or heated at a specific moment. Thus, not the web 2 as a whole is cooled or heated, but only these parts of web 2 interacting with temperature-conditioning unit 14 in a specific moment of operation of apparatus 1.

Preferably, temperature-conditioning unit 14 is adapted to cool or heat web 2 at least at station 10; i.e. at least during activation of pigments 3 by activation unit 9 at station 10 or at least during ablation of web 2. In the embodiment shown, temperature-conditioning unit 14 is adapted to cool or heat web 2 prior, during and after activation of pigments 3 at station 10.

In particular, temperature-conditioning unit 14 is adapted to actively cool or heat web 2 during a respective portion of path P1 and/or a respective portion of path P2. In other words, temperature-conditioning unit 14 is adapted to cool or heat each section of web 2 for a defined temperature-conditioning time t. Temperature-conditioning time t being less than the time needed for web 2 to travel from station 7 to station 8 or from station 8 to station 7. In particular, the ratio between the temperature-conditioning time t and the time to advance from station 7 to station 8 or vice-versa ranges between $\frac{1}{5}$ and $\frac{1}{20}$.

Even more particular, temperature-conditioning unit 14 is configured such that the temperature-conditioning time t ranges between 34 ms to 140 ms, in particular between 40 ms to 60 ms, even more particular for 56 ms. Even more particular, web 2 is cooled or heated for the same time prior and after activation of pigments 3 at station 10. Thus, each section of web 2 is cooled or heated respectively for about between 17 ms to 70 ms, in particular between 20 ms to 30 ms, even more particular for 28 ms prior and after activation of pigments 3 at station 10.

In more detail, temperature-conditioning unit 14 is adapted to cool or heat web 2 in the proximity of station 10, in particular so as to avoid a loss in the integrity of web 2.

In even more detail, temperature-conditioning unit 14 is adapted to cool or heat web 2 between a first temperature-conditioning station 43 and a second temperature-conditioning station 44. Station 43 and station 44 being interposed between station 7 and station 8.

In particular, temperature-conditioning unit 14 comprises an contact surface for cooling or heating web 2 with which web 2 is at least partially, preferably fully in contact with. In particular, web 2 is at least partially, in particular fully in contact with the contact surface along its extension in direction T. Due to the advancement along direction D web 2 is in contact with the contact surface also along its extension in direction D. Preferably, web 2 is at least partially, in particular fully in contact with the contact surface in the area of station 10.

In particular, web 2 is at least partially, preferably fully in contact with the contact surface between stations 43 and 44.

In particular, the contact surface is arranged in the area of station 10, even more particular the contact surface is arranged such that web 2 is, in use, in contact with the contact surface at least during activation of pigments 3, preferably prior, during and after the selective activation of pigments 3 at station 10 by activation device 32, in particular by laser assemblies 33.

More specifically, temperature-conditioning unit 14 comprises a temperature-conditioning roller 45 having an outer lateral surface. The outer lateral surface of roller 45 defines the contact surface of temperature-conditioning unit 14. In other words, the outer lateral surface of roller 45 is the contact surface.

In particular, temperature-conditioning roller 45 is arranged between station 7 and station 8, in particular in the area of station 10.

Even more specifically, temperature-conditioning roller 45 is rotatable around a respective rotation axis C, in particular being parallel to axes A and B. In use, rotation axis C is transversal to web 2, in particular orthogonal to web 2. In other word, in use, temperature-conditioning roller 45 is substantially parallel to direction T.

More precisely, temperature-conditioning roller 45 is arranged on support plate 24 and protrudes away from support plate 24. In particular, temperature-conditioning roller 45 is perpendicular to support plate 24.

Preferably, temperature-conditioning roller 45 is adapted to be actively cooled or heated, in particular to be conditioned to a temperature between 10° C. and 40° C., preferably between 15° C. and 30° C., even more preferably between 20° C. and 28° C. In particular, temperature-conditioning roller 45 is adapted to be internally cooled or heated so as to cool or heat the outer lateral surface of roller 45. Even more particular, temperature-conditioning roller 45 is adapted to be cooled or heated by a temperature-conditioning fluid, in particular a temperature-conditioning liquid, circulating within temperature-conditioning roller 45. Most preferably, temperature-conditioning roller 45 is adapted to be cooled by a cooling fluid, in particular a cooling liquid, circulating within temperature-conditioning roller 45.

Preferentially, temperature-conditioning roller 45 comprises a conduit (not shown) for receiving the flow of temperature-conditioning fluid, in particular the temperature-conditioning liquid.

Temperature-conditioning unit 14 also comprises a respective drive assembly, in particular an electrical motor 48 adapted to actuate rotation of temperature-conditioning roller 45 around axis C.

In particular, motor 48 is connected to support plate 24, in particular at a side of support plate 24 opposite to the side to which temperature-conditioning roller 45 is mounted to.

Preferentially, motor 48 is connected, in particular electronically connected, to control unit 15.

In a preferred embodiment, motor 48 acts as a master; i.e. control unit 15 is adapted to control rotation of discs 19 around the respective axes B as a function of rotation of temperature-conditioning roller 45 around axis C.

Advantageously, but not necessarily temperature-conditioning unit 14 also comprises a contact establishing assembly 49 adapted to establish, in use, contact of web 2 with the contact surface, in particular temperature-conditioning roller 45, even more particular the outer lateral surface of roller 45. In particular, assembly 49 is adapted to establish contact between web 2 and temperature-conditioning roller 45, in particular the outer lateral surface of roller 45 between station 43 and station 44. In this way, assembly 49 allows to control the contact surface area between web 2 and temperature-conditioning roller 45, in particular the outer lateral surface of roller 45, so as to control the temperature-conditioning time and efficiency. Furthermore, in this way, assembly 49 allows to control the overall area of web 2 being in contact with temperature-conditioning roller 45, in particular the outer lateral surface of roller 45.

In particular, assembly 49 comprises two auxiliary rollers 50 and 51 adapted to establish, in use, contact of web 2 with temperature-conditioning roller 45, in particular the outer lateral surface of roller 45 between respectively station 43 and station 44. In particular, rollers 50 and 51 being adapted each to rotate around a respective rotation axis E.

More specifically, temperature-conditioning roller 45 is interposed between rollers 50 and 51.

Even more specifically, roller 50 is placed between station 7 and temperature-conditioning roller 45 and roller 51 is placed between temperature-conditioning roller 45 and station 8. In particular, roller 45 being arranged downstream of roller 50 and upstream of roller 51 along path P1. In other words, roller 45 being arranged downstream of roller 51 and upstream of roller 51 along path P2.

In particular, in use, web 2 is interposed between roller 50 and temperature-conditioning roller 45 at station 43 and is interposed between roller 51 and temperature-conditioning roller 45 at station 44. In use, web 2 is in contact with the respective outer lateral surface of rollers 50 and 51.

Preferably, assembly 49 further comprises a positioning group 52 for selectively positioning rollers 50 and 51 with respect to roller 45. In particular, device 51 is adapted to position rollers 50 and 51 in such a manner so as to define the contact area of web 2 with roller 45, in particular the outer lateral surface of roller 45. Even more particular, group 52 is adapted to independently move rollers 50 and 51 into two directions orthogonal to the respective axes E.

Figure 6:
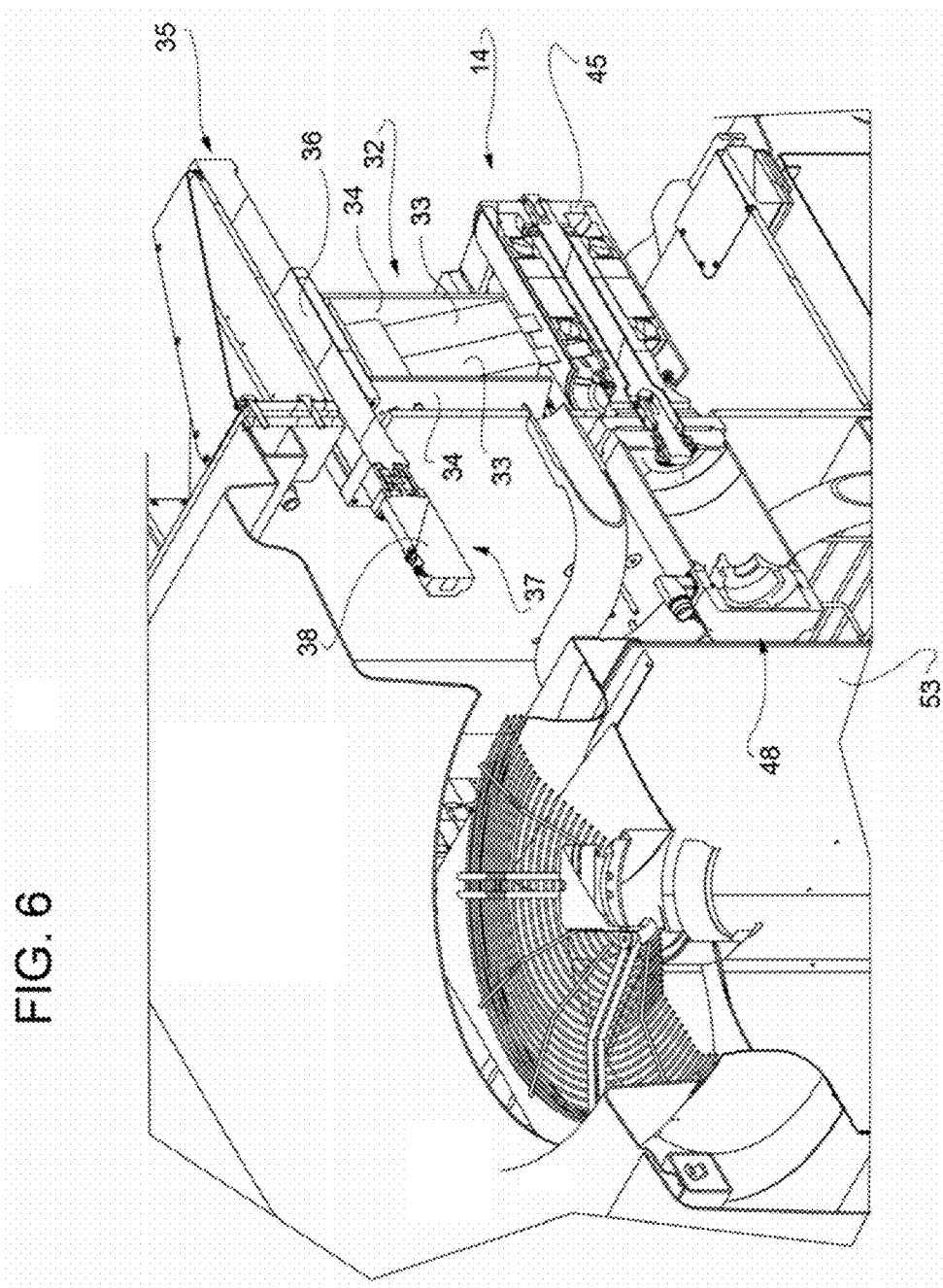
FIG. 6 is a partially sectionized top view along the plane VI-VI in FIG. 1, with parts removed for clarity.

With particular reference to FIGS. 1, 6 and 7, temperature-conditioning unit 14 further comprises at least one temperature-conditioning device 53, in particular a cooling aggregate, adapted to cool or heat, in particular to cool, roller 45, in particular the outer lateral surface of roller 45.

More specifically, device 53 is fluidically connected to the conduit and is adapted to direct the temperature-conditioning fluid, in particular the cooling fluid through the conduit.

Preferably, device 53 is adapted to cool assembly 39, in particular each one of controllers 40.

With particular reference to FIGS. 1, 3 and 4 control unit 15 comprises an inspection assembly 58 adapted to inspect web 2, in particular for inspecting web 2 after the selective activation of pigments 3 at station 10. In other words, assembly 58 is adapted to inspect web 2 after decoration of web 2. In particular, assembly 58 is adapted to inspect web 2 for determining the quality and/or correctness of the decoration applied to web 2. Even more in particular, assembly 58 is adapted to inspect web 2 for determining the quality and/or correctness of the decoration applied to each part of web 2, which defines one respective single label sheet, which are to be cut from web 2, in use, within a labeling machine.

Preferably, assembly 58 is also adapted to inspect web 2 prior to the selective activation of pigments 3 at station 10. In other words, assembly 58 is preferably also adapted to inspect web 2 prior to decoration of web 2. In particular, inspection of web 2, in use, prior to the selective activation of pigments 3 at station 10 allows to control the operation of activation unit 9 in such a manner to correctly decorate web 2. Preferably, inspection of web 2, in use, prior to the selective activation of pigments 3 also allows to obtain respective reference information (such as reference images) prior to activation of pigments 3.

In more detail, assembly 58 is adapted to optically analyze web 2, in particular assembly 58 is adapted to obtain images from web 2, at at least a first inspection station 60, preferably at the first inspection station 60 and at a second inspection station 59.

In even more detail, assembly 58 comprises at least a first optical sensor member 61 arranged at station 59 and a second optical sensor member 62 arranged at station 60. In the particular embodiment disclosed, station 60 is arranged between station 7 and station 10; and station 59 is arranged between station 10 and station 8.

Sensor members 61 and 62 can be a photosensor, a camera or any other optical sensor, which is adapted to inspect web 2, in particular to inspect graphical markers and/or images and/or text on web 2.

In particular, control unit 15 also comprises an analysis group 63 adapted to receive signals from assembly 58 and to analyze the signals in such a manner to determine the quality of the applied decoration and/or the correctness of the applied decoration.

Even more particular, analysis group 63 is also adapted to analyze the advancement of web 2 and to provide for a feedback about the correct advancement of web 2 between stations 7 and 8. Unit 15 is adapted to control advancement of web 2 between stations 7 and 8 as a function of the information obtained from analysis group 63, in particular for guaranteeing the correct alignment of web 2, in particular of the single label sheets to be cut, at station 10.

Preferably, unit 15, also comprises a memory group 64 adapted to at least temporarily store/memorize information of the correct or incorrect decoration of web 2, in particular of each one of the single label sheets of web 2.

With particular reference to FIGS. 1 and 3, control unit 15 also comprises a first reel diameter detection sensor 65 adapted to detect and/or determine the diameter of web 2 wound-up on reel 18 arranged at station 7; and a second reel diameter detection sensor 66 adapted to detect and/or determine the diameter of web 2 wound-up on reel 18 arranged at station 8.

In particular, unit 15 is adapted to selectively control the rotational speed of reels 18 around their respective axes A as a function of the respective diameter. In particular, unit 15 is adapted to control the respective drive unit 29, in particular the respective drive assemblies so as to control the rotational speeds of reels 18.

Even more particular, unit 15 is adapted to increase the rotational speed of the respective reel 18 when, in use, the diameter reduces and is adapted to decrease the rotation speed of the respective reel 18 when, in use, the diameter increases.

In use, prior to operation of apparatus 1 a set-up step is performed, during which a reel 18 with wound-up web 2 is placed within unit 16 and an empty reel 18 is placed within unit 17. Web 2 may be of the pre-decorated/pre-printed type or may be blank.

Then, during a second part of the set-up step, web 2 is guided around rollers 31 and through a portion of unit 14 so as to guide the leading edge towards reel 18 placed within unit 17, in particular to finally connect the leading edge of web 2 to reel 18 placed within unit 17. In particular, web 2 is guided around rollers 31 and around roller 45.

It must be noted that it is also possible to place reel 18 having a wound-up web 2 within unit 17 and to place the empty reel 18 within unit 16.

Preferably, after alignment of web 2 between station 7 and station 8 a positioning step is executed, during which device 32, in particular assemblies 33 are positioned with respect to web 2. In particular, device 32, in particular assemblies 33 are positioned with respect to web 2 by activation of assembly 35.

Advantageously, an advancement step is executed during which web 2 is advanced between station 7 and station 8, in particular along path P1 or path P2. More specifically, web 2 is advanced between station 7 and station 8 by conveying means 6. Even more specifically, web 2 is advanced by activation of drive unit 29, in particular by activation of respectively the first drive assembly and second drive assembly 30 of drive unit 29. In particular, drive unit 29, even more particular the first drive assembly and second drive assembly 30 actuate rotation of the respective reels 18 around the respective axes A.

Preferably, web 2 is advanced between station 7 and station 8 at an advancement speed between 0.5 m/s to 10 m/s, in particular at an advancement speed between 3 m/s to 8 m/s, even more particular at an advancement speed of 4 to 6 m/s. In particular, unit 15 controls the advancement speed of web 2. The advancement speed can be varied.

During advancement of web 2 between station 7 and station 8, also an activation step is executed, during which pigments 3 are selectively activated at station 10 by application of an activation energy, in particular an electromagnetic activation energy, even more particular by laser light irradiation.

In more detail, the activation energy, in particular the electromagnetic activation energy, even more particular the laser light irradiation is applied by activation of unit 9, in particular by activation of device 32, even more particular by selective activation of assemblies 33.

In even more detail, control unit 15 controls control assembly 39, in particular controllers 34 in such a manner to selectively control the intensity of the activation energy, in particular the electromagnetic activation energy, even more particular the intensity of the laser light irradiation.

In even more detail, each assembly 33 selectively turns on and off the laser irradiation along its respective activation line.

Advantageously, during advancement of web 2 between station 7 and station 8 and prior, during and/or after the selective activation of pigments 3 at station 10, in particular by activation of unit 9, a cooling step is executed during which web 2 is actively cooled. More specifically, web 2 is cooled or heated at least during the selective activation of pigments 3 at station 10, in particular by activation of unit 9. Even more specifically, web 2 is actively cooled or heated prior, during and after the selective activation of pigments 3 at station 10.

Preferably, web 2 is temperature-conditioned to a temperature between 10° C. and 40° C., preferentially between 15° C. and 30° C., even more preferentially between 20° C. and 28° C.

In particular, the temperature-conditioning time t ranges between 34 ms to 140 ms, in particular between 40 ms to 60 ms, even more particular the temperature-conditioning time is 56 ms. Even more particular, web 2 is cooled or heated for the same time prior and after activation of pigments 3 at station 10. Thus, web 2 is cooled or heated respectively for about between 17 ms to 70 ms, in particular between 20 ms to 30 ms, even more particular for 28 ms prior and after activation of pigments 3 at station 10. It must be noted that the activation time can be, at least from a practical point of view considered instantaneous.

In more detail, web 2 is cooled or heated by temperature-conditioning unit 14. In even more detail, web 2 is at least partially, preferably fully in contact with the contact surface, in particular with the outer lateral surface of temperature-conditioning roller 45. In particular, web 2 is in contact with the contact surface, in particular the outer lateral surface of roller 45 between stations 43 and 44. More specifically, stations 43 and 44 are defined by assembly 49, in particular by the specific positioning of rollers 50 and 51.

Temperature-conditioning roller 45 rotates around axis C. In particular, rotation of temperature-conditioning roller 45 is actuated by drive assembly 48. Even more particular, temperature-conditioning roller 45 acts as a master, so that control unit 15 controls rotation of discs 19 as a function of the rotation speed of roller 45. I.e. control unit 15 controls rotation of reels 18 around their respective axes A as a function of the rotation speed of roller 45.

In further detail, the contact surface, in particular the outer lateral surface of temperature-conditioning roller 45 is cooled by a flow of a temperature-conditioning fluid, in particular a flow of a temperature-conditioning liquid, within temperature-conditioning roller 45. In even further detail, the temperature-conditioning fluid, in particular the temperature-conditioning liquid circulates within the conduit. In particular device 53 tempers the temperature-conditioning fluid and directs the temperature-conditioning fluid into the conduit and recollects the temperature-conditioning fluid after exiting the conduit.

During operation of apparatus 1 also one or more steps of repetition can be executed; i.e. to advance web 2 more than once between station 7 and B. In such a manner it is possible to decorate different decoration areas of web 2, the decoration areas being distinct from one another or being partially overlapping. For this purpose it is also possible to change the position of activation device 32, in particular of laser assemblies 33, in particular by activation of assembly 35.

In particular, web 2 advances along path P1 and along path P2 as often as needed until all areas of web 2 to be decorated are decorated. It must be understood that it is also possible to operate apparatus 1 such that web 2 is always advanced along path P1 or always along path P2. Such an operation would require to remove and replace reels 18 after each run.

In further detail, during advancement of web 2 the following additional steps are executed:
- a detection step for detecting any portions of web 2 having defective decorations; and
- an information application step for providing information about the portions of web 2 detected during the detection step on web 2 onto web 2.

Preferably, during advancement of web 2 also a memorizing step for at least temporarily memorizing the information about the portions of web 2 detected during the detection step is executed. The memorizing step being prior to the information application step, and in particular during the detection step.

In more detail, during the detection step assembly 58 inspects the decorations of web 2 obtained by activation of pigments 3. In particular, assembly 58 images the portions of web 2, which define the single label sheets of web 2 (i.e. the portions of web 2, which after cutting define the single label sheets). Even more particular, assembly 58 images web 2 at least after activation of pigments 3 at station 10, preferably assembly 58 also images web 2 also prior to activation of pigments 3 at station 10. I.e. web 2 is imaged at station 59 or 60 or at stations 59 and 60 by respective member 61 and/or member 62. Assembly 58 sends the images of web 2 to analysis group 63.

Then, analysis group 63 analyses the decoration obtained after activation of pigments 3 at station 10 as a function of the respective portions (the single label sheets). In particular, analysis group 63 compares the images of web 2 obtained after and prior to the activation of pigments 3 in dependence of the respective portions of web 2 (the single label sheets). Then, analysis group 63 determines the correctness and or defectiveness of the decoration in dependence of the respective portion of web 2 (the respective single label sheet), in particular for determining any defective portion of web 2.

Then, during the memorizing step memorizing group 64 at least temporarily stores the information about the portions detected during the detection step.

During the information application step the information about the defective portions of web 2 is codified onto web 2 by activating pigments 3 at station 10. During the information application step also any additional information such as e.g. information about personalized graphical or written information, the production facility, the packaged product and so on can be included into the codified information too. Preferably, the information application step is performed at the end of the overall decoration of web 2. In particular, in the case of the execution of advancing the web 2 between station 7 and station 8 more than once, after termination of each one of the single advancements (i.e. after termination of all steps of repetition). Preferably, the codified information is provided within the proximity of the leading edge of web 2 (i.e. the edge of web 2, which defines to be the leading edge 2 once being placed within a labeling machine).

Alternatively, a sticker or the like may be printed with the codified information and the sticker may be applied onto web 2. Another alternative is, to store the information electronically and to provide the information to a labeling machine electronically.

Preferably, prior to operation of apparatus 1 a tuning step is executed, during which tuning of unit 9, in particular of device 32, even more particular of assemblies 33 is performed for determining the working parameters of unit 9, in particular of device 32, even more particular of assemblies 33. Such a tuning can e.g. be performed after spanning of web 2 between stations 7 and 8.

In the present context, the tuning step regards the determination of the needed intensity so as to obtain a desired color, such as a desired grey scale or a color tonality. In other words, assembly 39 controls the intensity setting of device 32, in particular of assemblies 33 such that a certain intensity is provided for the selective activation of pigments 3 in order to obtain a defined color.

Figure 8:
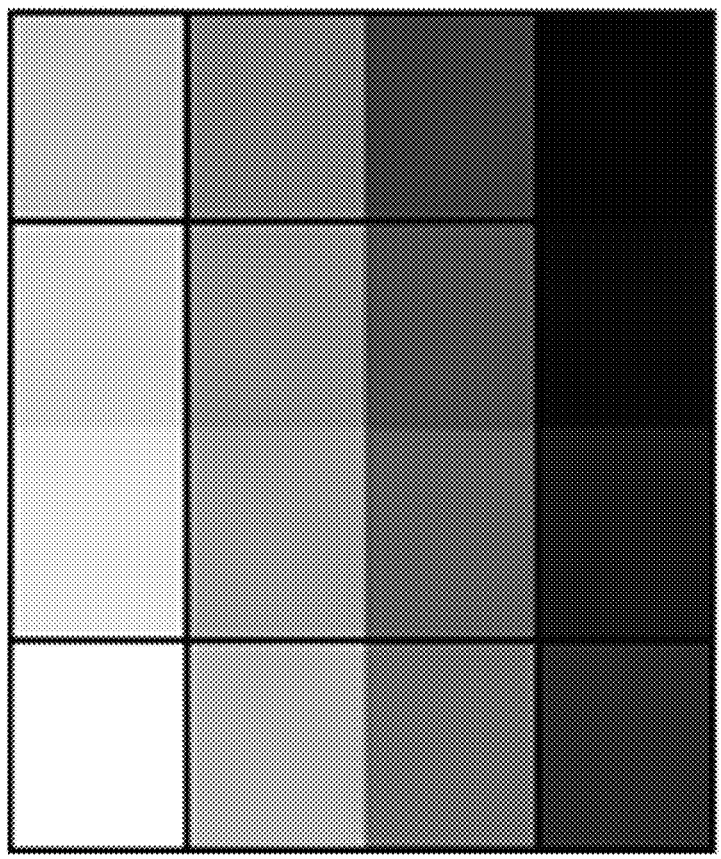
FIG. 8 shows a gauging matrix required for gauging the operation of components of the decoration apparatus of FIG. 1, with parts removed for clarity.
Figure 9:
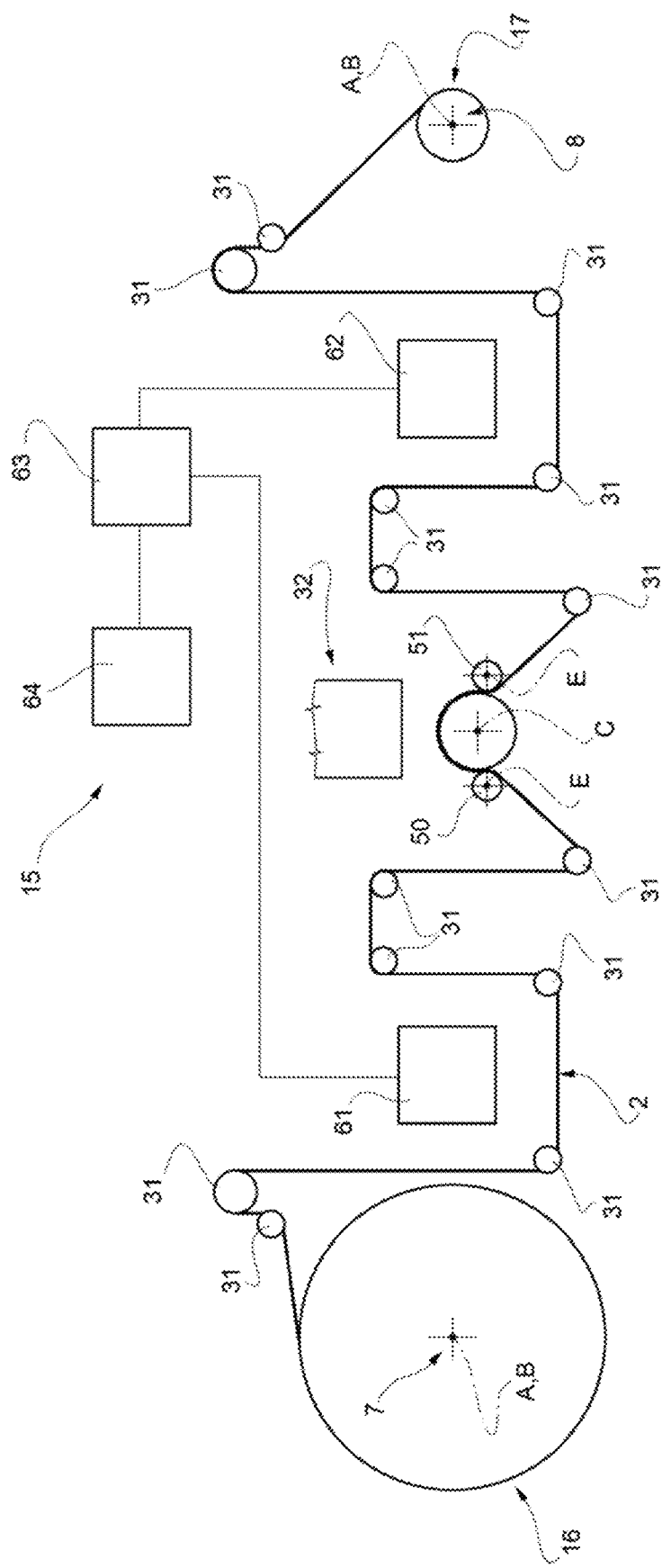
FIG. 9 schematically illustrates a working operation of the decoration apparatus according to the first embodiment of the present invention, with parts removed for clarity.

With reference to FIG. 8, the tuning of unit 9 is performed according to the following steps:
- a respective activation step at which unit 9, in particular device 32, even more particular assemblies 33 are selectively activated in order to obtain a color matrix according to what is shown in FIG. 8 (in the particular case shown, a matrix of grey scales);
- a comparison step at which the obtained color matrix is confronted, in particular after having been imaged by means of assembly 58, with a reference color matrix (gauging matrix) and the differences between the obtained color matrix and the reference color matrix are analyzed; and
- an adaption step at which assembly 39 adapts the intensity setting of device 32, in particular of assemblies 33.

The activation step, the comparison step and the adaption step are repeated until the obtained color matrix is substantially identical to the reference color matrix. Substantially identical means in this context that the determined and/or detected differences are within a pre-defined tolerance. Note that such a tolerance may differ from web of labeling material to web of labeling material or from production facility to production facility.

In particular, the comparison step is automatically performed by unit 15, in particular by group 63. Additionally, preferably, the adaption step is performed automatically, in particular by unit 15.

Alternatively, the comparison step and the adaption step could be performed manually by an operator.

It must be noted that such a tuning step must not necessarily be performed prior to each operation of apparatus 1. Preferably, the tuning is executed according to pre-defined time-intervals, which are a function of the details of the material of web 2 used, the quality requirements on the decorations to be applied onto web 2, the environmental conditions and others. Another motivation to perform such a tuning can be related to a change of the kind of web 2 to operate with (change of material, etc.).

Figure 10:
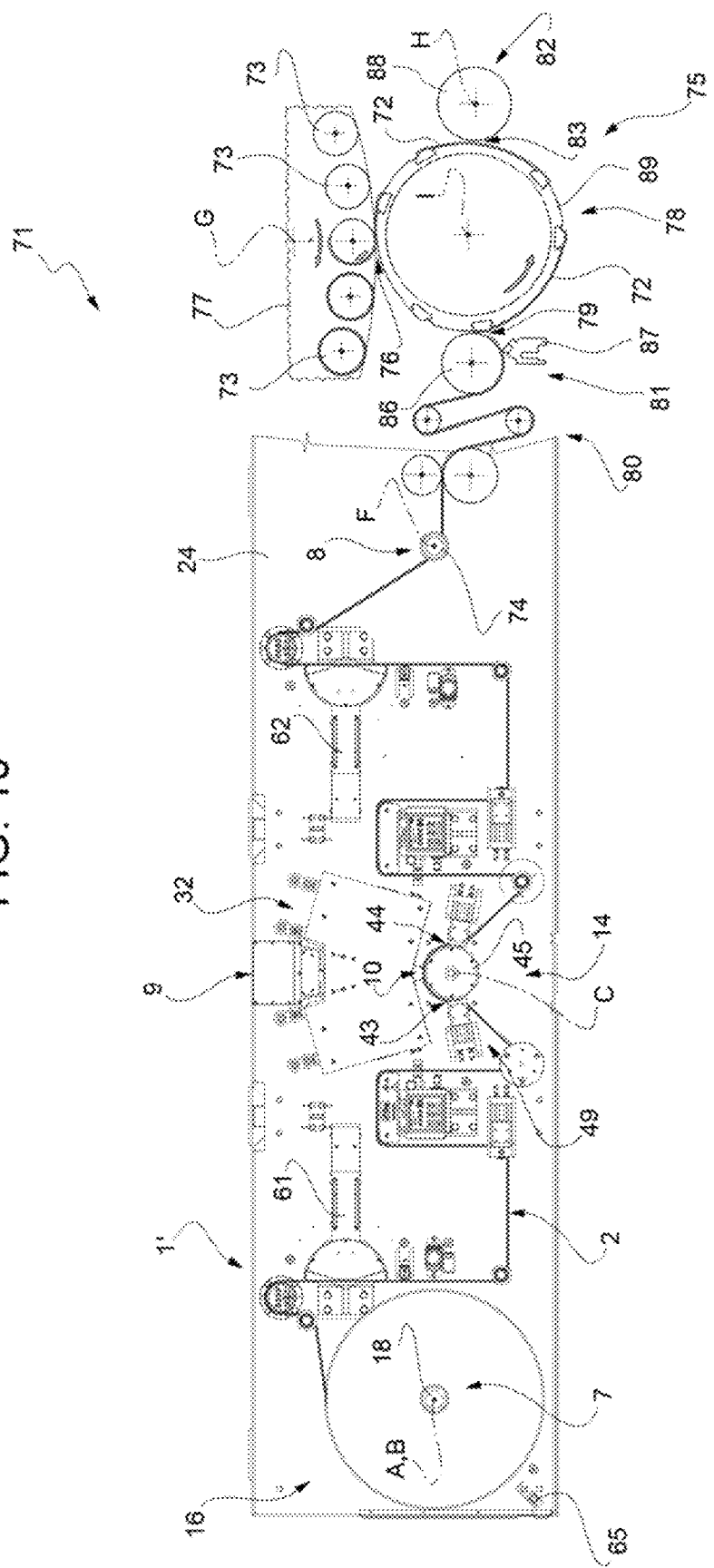
FIG. 10 is a schematic top view of a labeling machine having a decoration apparatus according to a second embodiment of the present invention, with parts removed for clarity.

With reference to FIG. 10, number 1' indicates as a whole a second embodiment of a decoration apparatus according to the present invention. In particular, apparatus 1' being part of a labeling machine 71 for applying label sheets 72 onto receptacles, in particular bottles 73.

As apparatus 1' is similar to apparatus 1, the following description is limited to the differences between them, and using the same references, where possible, for identical or corresponding parts.

In particular, apparatus 1' differs from apparatus 1 in not comprising a second magazine unit. Instead, apparatus 1' comprises a roller 74 arranged at station 8. Preferentially, roller 74 being adapted to rotate around a respective rotation axis F. Furthermore, in the specific example shown, support plate 24 of apparatus 1' is oriented horizontally.

Furthermore, apparatus 1' is adapted to directly cooperate with a labeling apparatus 75 of labeling machine 71, in particular so as to decorate web 2 (and therewith, label sheets 72) shortly prior to the labeling of bottles 73.

Note that in the particular embodiment disclosed apparatus 75 is adapted to work with the self-stick label type. However, alternatively, the labeling apparatus could also be of the kind operating with sleeve-labels or pressure sensitive labels.

In more detail, labeling apparatus 75 is adapted to apply label sheets 72 to bottles 73 at a label application station 76.

More specifically, labeling machine 71 comprises labeling apparatus 75 and apparatus 1'. Even more specifically, labeling machine 71 also comprises a conveyor device, in particular a conveying carousel 77 adapted to advance bottles 72 along a receptacle advancement path.

In particular, conveying carousel 77 is adapted to support bottles 73 on its periphery and to rotate the same along the receptacle advancement path around a respective rotation axis G, in particular the bottle advancement path being arc-shaped. Preferentially, carousel 77 is also adapted to rotate bottles 73 around their respective longitudinal axes while being advanced along the receptacle advancement path.

Labeling apparatus 75 also comprises:
a transfer device 78 configured to transfer label sheets 72 from a receiving station 79 to station 76, at which label sheets 72 are applied onto respective bottles 73;
a feeding device 80 for feeding web 2 to station 79;
a cutting unit 81, arranged adjacent to station 79 for cutting label sheets 72 from web 2; and
a glue application unit 82 arranged adjacent to at least a portion of transfer device 78 and between station 79 and station 76 and adapted to apply, at a glue application station 83, a pattern of glue on the backside of each label sheet 72 prior to reaching label application station 76.

In more detail, feeding device 80 is adapted to receive web 2 from apparatus 1'.

In particular, feeding device 80 is adapted to cooperate with apparatus 1' so as to advance web 2 from station 7 to station 8 and to further advance web 2 to device 80. In particular, feeding device 80 is arranged downstream from station 8.

More specifically, cutting unit 81 comprises:
a rotary cutting drum 86 arranged adjacent to at least a portion of device 78 and carrying, on its outer lateral surface, web 2; and
a stationary cutter blade or cutter 87 carried in a fixed position on one side of drum 86 and proximal to receiving station 79 so as to cooperate, in use, with drum 86 to cut one label sheet 72 at a time from web 2. In particular, unit 81 is adapted to cut label sheets 72 of defined lengths.

More specifically, glue application unit 82 comprises a glue application roller 88. In particular, glue application roller 88 is arranged adjacent to station 83 and is adapted to rotate about its respective rotation axis H.

Alternatively, glue application unit 82 could comprise glue injection nozzles.

In a further alternative not shown, apparatus 75 could comprises a glue application unit for applying glue directly onto bottles 73.

More specifically, transfer device 78 comprises a transfer drum 89 rotatable around a central axis I. Drum 89 is adapted to retain label sheets 72 on its outer lateral surface during advancement of label sheets 72 from station 83 to station 76.

More specifically, transfer drum 89 is arranged peripherally adjacent, preferably tangential, to glue application unit 82, in particular glue application roller 82 at station 83. Even more specifically, transfer drum 89 is also arranged peripherally adjacent, preferably tangential, to drum 86 at station 79, and to carousel 77 at station 76.

During function of machine 71 bottles 73 are advanced along the receptacle advancement path and, preferably, bottles 73 are rotated around their respective longitudinal axes during advancement along the receptacle advancement path for supporting the application of respective label sheets 72 onto bottles 73.

Simultaneously, label sheets 72 are advanced from station 79 to station 76, in particular by transfer device 78, even more particular by rotation of drum 78 around axis I. Label sheets 72 are applied onto bottles 73 at station 76. Preferably, a pattern of glue is applied, in particular by unit 82, onto label sheets 72 at station 83 (i.e. the pattern of glue is applied onto label sheets 72 prior to application of label sheets 72 onto bottles 73).

Label sheets 72 are obtained from web 2 by cutting unit 81 cutting web 2.

Web 2, in particular the label sheets 72 obtained after cutting, are decorated by apparatus 1' prior to feeding web 2, in particular the respective label sheets 72 (prior to being separated by cutting from web 2) to apparatus 75.

Apparatus 1' operates in a similar way to apparatus 1. This is why only briefly the differences between operation of apparatus 1' with respect to apparatus 1 is described.

The main difference results from apparatus 1' not having a second magazine unit 17, but having roller 74 instead.

Accordingly, web 2 advances from station 7 to station 8. Then, web 2 is further advanced from station 8 to apparatus 75, in particular to feeding device 80.

Prior to operation of machine 71 a reel 18 with wound-up web 2 is placed within unit 16.

Then web 2 is guided around rollers 31 and through a portion of unit 14 to roller 74. From roller 74 web 2 is guided to apparatus 75, in particular through device 80 towards station 79.

The advantages of apparatuses 1 and 1' according to the present invention will be clear from the foregoing description.

In particular, apparatuses 1 and 1' allow to decorate a web 2 in a flexible manner, even more particular it is possible to personalize the decoration in an easy and straight forward manner.

Furthermore, apparatuses 1 and 1' allow to decorate a web 2 by advancing web 2 also at higher advancement speeds with respect to the apparatuses known in the art.

In particular, in the case web 2 is cooled during its advancement it is possible to operate with increased activation energies (laser irradiation intensities) allowing thereby to increase the advancement speed of web 2 with respect to the decoration apparatuses known in the art. As well, in the case web 2 is heated during its advancement it is possible to precondition web 2, in a particular pigments 3 so as to operate at decreased activation energies (laser irradiation intensities) allowing thereby to increase the advancement speed of web 2 with respect to the decoration apparatuses known in the art.

In addition, an apparatus according to the present invention can be easily adapted to be used in an off-line mode (see apparatus 1) or in an on-line mode (see apparatus 1').

Furthermore, decoration by apparatuses 1 and 1' allows to reduce costs with respect to the decoration apparatuses known in the art.

Additionally, the activation of pigments 3 during use of apparatuses 1 and 1' allows to obtain personalized label sheets, which do not come along with any health hazards due to the migration of any printing compounds into the packaged food product as it is the case for known decoration apparatuses.

Another advantage of apparatuses 1 and 1' is that it comes along with an auto-tuning process, allowing to automatically obtain the required operation parameters of, in particular, activation device 32 so as to control the quality of the decoration.

A further advantage of apparatus 1 is that web 2 can be decorated prior to being inserted within a labeling machine. This also allows to perform repeated decoration of web 2 by advancing web 2 repeatedly between station 7 and station 8. This may allow to reduce the number of laser assemblies 33, further reducing the overall cost of such an apparatus 1.

An additional advantage of apparatus 1 is that at the end of the decoration of web 2, it is possible to apply information about the decorated web 2 onto web 2 itself. Thus, it is possible for a labeling machine to directly obtain from web 2 itself all the information about the quality and possible defects of web 2, in particular the respective label sheets. This then allows to control operation of the labeling machine itself as a function of any possible defects of web 2, in particular the respective label sheets.

A further advantage is that an apparatus according to the present invention, in particular apparatus 1', can be easily integrated into existing labeling machines or into a labeling machine 71. This is independent of the kind of labeling machine, thus, independent of whether the labeling machine deals with self-stick labels, sleeve labels or pressure-sensitive labels.

Clearly, changes may be made to apparatuses 1 and 1' as described herein without, however, departing from the scope of protection as defined in the accompanying claims.

In an alternative embodiment not shown, activation unit 9 of apparatus 1 or apparatus 1' is adapted to locally ablate web 2 during advancement of web 2 between station 7 and station 8. In such an alternative embodiment, web 2 does not need to comprise pigments 3, but apparatus 1 or apparatus 1' can be operated with any kind of web 2. During operation, in particular during the activation step web 2 is locally ablated by means of the activation energy, in particular the electromagnetic activation energy, even more particular laser light irradiation at station 10.

The invention claimed is:

1. Decoration apparatus (1, 1') for decorating a web of labeling material (2) comprising:
   conveyor (6) for advancing the web of labeling material (2) between a first station (7) and a second station (8);
   an activation unit (9) adapted to apply an electromagnetic activation energy at an activation station (10) onto the web of labeling material (2) for selectively activating photoactivatable pigments (3) present in the web of labeling material (2); and
   a temperature-conditioning unit (14),
   wherein:
      at least a portion of the temperature-conditioning unit (14) is arranged between the first station (7) and the second station (8);
      the activation unit (9) comprises at least one laser assembly (33) adapted to direct at the activation station (10), in use, a laser irradiation onto the advancing web of labeling material (2); and
      the temperature-conditioning unit (14) is adapted to (i) actively cool and heat the web of labeling material (2), and (ii) in use, cool and heat the web of labeling material (2) prior, during or after selective activation of the activatable pigments (3).

2. The decoration apparatus according to claim 1, wherein the temperature-conditioning unit (14) comprises a contact surface for temperature-conditioning the web of labeling material (2) and the web of labeling material (2) is at least partially in contact with the contact surface between a first temperature-conditioning station (43) and a second temperature-conditioning station (44), the first temperature-conditioning station (43) and the second temperature-conditioning station (44) being arranged between the first station (7) and the second station (8).

3. The decoration apparatus according to claim 2, wherein the temperature-conditioning unit (14) comprises a temperature-conditioning roller (45) having an outer lateral surface and the outer lateral surface of the temperature-conditioning roller (45) defining the contact surface.

4. The decoration apparatus according to claim 3, wherein the temperature-conditioning roller (45) comprises a conduit for receiving a temperature-conditioning fluid.

5. The decoration apparatus according to claim 1, further comprising:
   a first unit (16) arranged at the first station (7) and being adapted to store and receive the web of labeling material (2); and
   a second unit (17) arranged at the second station (8) being adapted to store and receive the web of labeling material (2),
   wherein the conveyor (6) are also adapted to advance the web of labeling material (2) along a first advancement path (P1) from the first unit (16) to the second unit (17); and
   wherein the conveyor (6) are adapted to advance the web of labeling material (2) along a second advancement path (P2) from the second unit (17) to the first unit (16).

6. Labeling machine (71) for applying labels onto receptacles (73) comprising a decoration apparatus (1') according to claim 1.

7. Method of decorating a web of labeling material (2), the method comprising:
   a step of advancing the web of labeling material (2) between a first station (7) and a second station (8);
   an activation step during which an electromagnetic activation energy by laser light irradiation is directed onto the web of labeling material (2) at a activation station (10) for selectively activating photoactivatable pigments (3), present within the web of labeling material (2) or for locally ablating the web of labeling material (2); wherein the activation station (10) is arranged between the first station (7) and the second station (8); and a temperature-conditioning step during which the web of labeling material (2) is actively cooled and heated during advancement between the first station (7) and the second station (8) and prior, during or after the step of activation.

8. The method according to claim 7, wherein during the temperature-conditioning step, the web of labeling material (2) is conditioned to a temperature between 10° C. and 40° C., preferentially between 15° C. and 30° C., even more preferentially between 20° C. and 28° C.

9. The method according to claim 7, wherein during the temperature-conditioning step, the web of labeling material (2) is at least partially, preferentially fully in contact with a contact surface for cooling and or heating the web of labeling material (2).

10. The method according to claim 9, wherein the contact surface is an outer lateral surface of a temperature-conditioning roller (45) and during the temperature-conditioning step the temperature-conditioning roller (45) rotates around a central axis (C).

11. The method according to claim 9, wherein during the temperature-conditioning step the temperature of the contact surface is controlled by a flow of a temperature-conditioning fluid, in particular by a temperature-conditioning liquid.

12. The method according to claim 8, further comprising at least one step of repetition during which the step of advancing, the activation step and the temperature-conditioning step are repeated.

13. The method according to claim 12, wherein during the respective activation step of the respective step of repetition a respective decoration area of the web of labeling material (2) is decorated, wherein the respective decoration areas are distinct from one another or the respective decoration areas are partially overlapping.

14. The method according to claim 8, further comprising:
- a detection step for detecting any portions of the web of labeling material (2) having defective decorations; and
- an information application step for providing information about the portions of the web of labeling material (2) detected during the detection step onto the web of labeling material (2).

* * * * *